(12) United States Patent
Jeon et al.

(10) Patent No.: US 11,240,920 B2
(45) Date of Patent: Feb. 1, 2022

(54) FOLDABLE DISPLAY DEVICE HAVING ADJUSTABLE SUPPORT UNITS RETREATABLE INTO RECESSED PORTIONS OF SET FRAMES

(71) Applicant: LG DISPLAY CO., LTD., Seoul (KR)

(72) Inventors: Seungo Jeon, Seoul (KR); YoungJoon Yun, Paju-si (KR); ShinSuk Lee, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/048,897

(22) Filed: Jul. 30, 2018

(65) Prior Publication Data
US 2019/0208649 A1 Jul. 4, 2019

(30) Foreign Application Priority Data
Dec. 28, 2017 (KR) ........................ 10-2017-0182175

(51) Int. Cl.
*H05K 5/00* (2006.01)
*H05K 5/02* (2006.01)
(Continued)

(52) U.S. Cl.
CPC ......... *H05K 5/0017* (2013.01); *G06F 1/1641* (2013.01); *G06F 1/1652* (2013.01);
(Continued)

(58) Field of Classification Search
CPC .. H05K 5/0017; H05K 5/0217; H05K 5/0226; E05Y 2900/606; G06F 1/1641; G06F 1/1652; G06F 1/1681
See application file for complete search history.

(56) References Cited

U.S. PATENT DOCUMENTS

| 5,268,817 | A | * | 12/1993 | Miyagawa | ............ | G06F 1/1618 |
| | | | | | | 361/679.06 |
| 8,363,391 | B2 | * | 1/2013 | Kim | ...................... | G06F 1/1681 |
| | | | | | | 361/679.01 |

(Continued)

FOREIGN PATENT DOCUMENTS

| KR | 10-2015-0096827 A | 8/2015 |
| KR | 10-2015-0142290 A | 12/2015 |
| KR | 10-2017-0000309 A | 1/2017 |

OTHER PUBLICATIONS

Korean Office Action dated Dec. 17, 2021 for Application No. 10-2017-0182175.

*Primary Examiner* — Rockshana D Chowdhury
*Assistant Examiner* — Douglas R Burtner
(74) *Attorney, Agent, or Firm* — Birch, Stewart, Kolasch & Birch, LLP

(57) ABSTRACT

A foldable display device is discussed, which is to be switched between a folded state and an unfolded state, the foldable display device including adjustable support units to support a display panel of the foldable display device together with an inner surface of set frames in the unfolded state, the adjustable support units being connected to a hinge unit to enable the adjustable support units to retreat to the inner surface of the set frames in the folded state. In the unfolded state, the adjustable support units and the set frames support the entire area of the display panel to be flat to reduce damage of the display panel.

14 Claims, 6 Drawing Sheets

(51) Int. Cl.
*G06F 1/16* (2006.01)
*E05D 3/14* (2006.01)
*E05D 3/18* (2006.01)

(52) U.S. Cl.
CPC ......... *G06F 1/1681* (2013.01); *H05K 5/0217* (2013.01); *H05K 5/0226* (2013.01); *E05D 3/14* (2013.01); *E05D 3/18* (2013.01); *E05Y 2900/606* (2013.01)

(56) References Cited

U.S. PATENT DOCUMENTS

| | | | | |
|---|---|---|---|---|
| 8,446,717 | B2* | 5/2013 | Tanaka | G06F 1/1681 |
| | | | | 361/679.27 |
| 9,348,450 | B1* | 5/2016 | Kim | G06F 1/1681 |
| 9,557,771 | B2* | 1/2017 | Park | G06F 1/1681 |
| 9,822,567 | B1* | 11/2017 | Lin | E05D 11/06 |
| 10,365,691 | B2* | 7/2019 | Bae | G06F 1/1616 |
| 10,585,457 | B2* | 3/2020 | Park | G06F 1/1652 |
| 10,659,577 | B2* | 5/2020 | Nam | G06F 1/1681 |
| 10,973,136 | B2* | 4/2021 | Park | G09F 9/301 |
| 2007/0121061 | A1* | 5/2007 | Kim | G02C 5/10 |
| | | | | 351/153 |
| 2013/0021762 | A1* | 1/2013 | van Dijk | H04M 1/022 |
| | | | | 361/749 |
| 2013/0037228 | A1* | 2/2013 | Verschoor | G06F 1/1652 |
| | | | | 160/377 |
| 2013/0044410 | A1* | 2/2013 | Verschoor | G06F 1/1652 |
| | | | | 361/679.01 |
| 2013/0058063 | A1* | 3/2013 | O'Brien | G06F 1/1652 |
| | | | | 361/807 |
| 2014/0042293 | A1* | 2/2014 | Mok | G06F 1/1652 |
| | | | | 248/682 |
| 2014/0123436 | A1* | 5/2014 | Griffin | H04M 1/0216 |
| | | | | 16/221 |
| 2014/0126133 | A1* | 5/2014 | Griffin | G06F 1/1652 |
| | | | | 361/679.27 |
| 2014/0340832 | A1* | 11/2014 | Kwon | H04M 1/0216 |
| | | | | 361/679.27 |
| 2014/0355181 | A1* | 12/2014 | Jung | G02F 1/133305 |
| | | | | 361/679.01 |
| 2014/0362507 | A1* | 12/2014 | Kinoshita | G06F 1/1618 |
| | | | | 361/679.09 |
| 2015/0366089 | A1* | 12/2015 | Park | G06F 1/1641 |
| | | | | 361/679.01 |
| 2016/0295709 | A1* | 10/2016 | Ahn | H05K 5/0226 |
| 2017/0115701 | A1* | 4/2017 | Bae | G06F 1/16 |
| 2017/0192460 | A1* | 7/2017 | Watanabe | G09F 9/00 |
| 2017/0374749 | A1* | 12/2017 | Lee | E05D 11/0054 |
| 2019/0369671 | A1* | 12/2019 | Seo | G06F 1/1681 |

* cited by examiner

FOLDABLE DISPLAY DEVICE HAVING ADJUSTABLE SUPPORT UNITS RETREATABLE INTO RECESSED PORTIONS OF SET FRAMES

CROSS-REFERENCE TO RELATED APPLICATION

This application claims the priority benefit of Korean Patent Application No. 10-2017-0182175 filed on Dec. 28, 2017, in the Korean Intellectual Property Office, the disclosure of which is incorporated herein by reference in its entirety.

BACKGROUND OF THE INVENTION

Field of the Invention

The present disclosure relates to a foldable display device, and more particularly to a foldable display device in which a hinge structure is improved to support a display panel of a foldable display device to be flat and secure an internal space for accommodating a display panel when the display panel is folded.

Description of the Related Art

Among display devices, which may be used as a television or monitor for a computer or a cellular phone, are organic light emitting display devices (OLED) which are self-emitting devices, and liquid crystal display devices (LCD) which require separate light sources.

Recently, foldable display devices capable of displaying images even when bent like paper, manufactured by forming display units and wiring lines on flexible substrates such as plastic, are getting attention as next generation display devices.

These foldable display devices include a display panel and a set frame, which supports and protects the display panel. The set frame also typically includes a rotating hinge unit that allows the display panel to be folded. When the foldable display device is folded, a space for accommodating the folded area of the display panel that is curved along a folding radius is necessary. Such a space is typically formed in the set frame to secure the curvature of radius of the display panel, but when the foldable display is unfolded, a partial area of the display panel overlapping the space is not supported. Therefore, it is difficult to maintain the flatness of the display panel. Further, this portion of the display panel is more susceptible to damage from external forces that may be applied through normal user use, such as touch operations or handwriting inputs.

SUMMARY OF THE INVENTION

When the foldable display device is folded, a space for accommodating a folded area of the display panel is necessary in the set frame and the hinge unit. This space for accommodating the folded area of the display panel may be created by removing a part of an inner surface of the set frame and the hinge unit, but then the area of the display panel overlapping this space is not supported in the unfolded state. Therefore, a mechanism to afford this space in the folded state, while supporting the partial area of the display panel corresponding to this space in the unfolded state is needed.

The subject of the present disclosure is such a foldable display device in which accommodating space for the folded portion of the display panel is provided while also supporting the display panel in an unfolded state.

Objects of the present disclosure are not limited to the above-mentioned objects, and other objects not mentioned can be clearly understood by those skilled in the art from the following descriptions.

According to an aspect of the present disclosure, a foldable display device which includes a hinge unit, one pair of set frames is connected to both sides of the hinge unit, a display panel which is at least partially supported by the inner surface of the set frames, and a pair of adjustable support units disposed on the inner surface of the set frames and connected to the hinge unit. In the unfolded state, the combination of the adjustable support units and the set frame support the entirety of the display panel, so that damage to the display panel may be reduced.

According to another aspect of the present disclosure, a foldable display device includes a hinge unit, one pair of set frames connected to both sides of the hinge unit, a display panel which is at least partially supported by the inner surface of the set frames, and a pair of adjustable support units which are connected to both sides of the hinge unit and, in the unfolded state, support the display panel together with the inner surface of the set frame. The adjustable support units are accommodated in the inner surface of the set frame in the folded state, where it affords an accommodating space that secures a margin of a radius of curvature for the display panel.

Other detailed matters of the embodiments are included in the detailed description and the drawings.

According to the present disclosure, the entire area of the display panel is supported in the unfolded state, allowing the display panel to be flat and thereby reducing potential damage thereto.

Further, according to the present disclosure, when the foldable display device is folded, the accommodating space secures a margin of a radius of curvature of the display panel.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
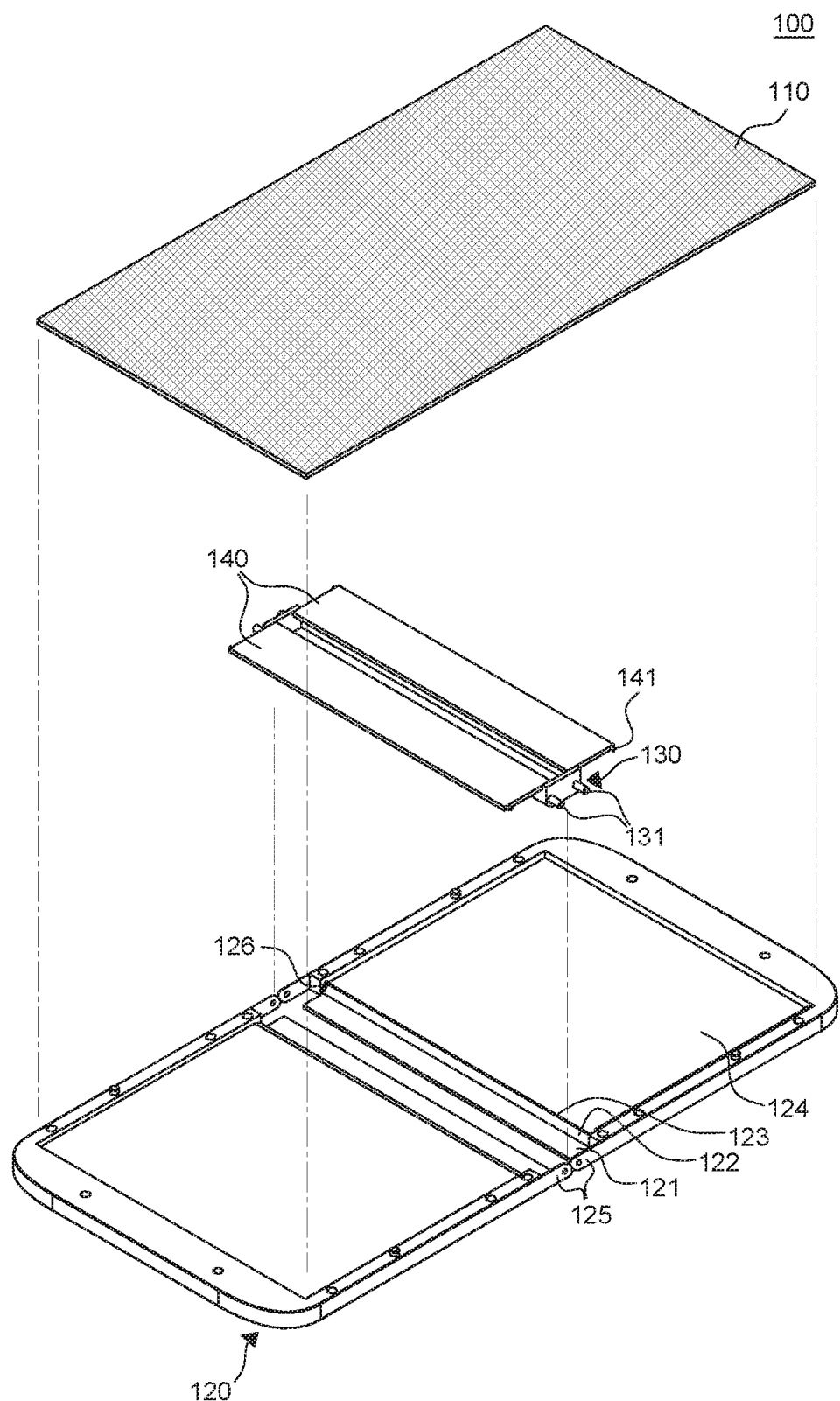
FIG. 1 is an exploded perspective view of a foldable display device according to an example embodiment of the present disclosure.

The advantages and features of the present disclosure, as well as the means by which these advantages and features can be realized will be clear by referring to the embodiments described below in greater detail, together with the accompanying drawings. However, the present disclosure is not limited to the embodiments disclosed herein, but may be implemented in a variety of different forms. The embodiments are provided by way of example only, so that a person of ordinary skill in the art can fully understand the present disclosure. The scope of the present disclosure will be defined by the scope of the appended claims.

The shapes, sizes, ratios, angles, numbers, and the like in the accompanying drawings illustrating the embodiments of the present disclosure are merely examples, and the present disclosure is not limited thereto. Like reference numerals generally denote like elements throughout the present specification. Further, in the following description of the present disclosure, a detailed explanation of known related technologies may be omitted to avoid unnecessarily obscuring the subject matter of the present disclosure. Terms such as, "including," "having," and "comprising," as used herein are generally intended to allow other components to be added unless the terms are used with the term "only." Any singular references may also be applied in the plural sense, unless expressly stated otherwise.

Descriptions and measurements of components should be interpreted to include an ordinary error range, even if not expressly stated.

When terms such as "on," "above," "below," and "next," are used to describe the position or relation between components, one or more other components may be positioned between said components unless the terms are used with the term "immediately," or "directly."

For example, when an element or layer is disposed "on" another element or layer, another layer or another element may be interposed directly on the other element or therebetween.

Although the terms "first," "second," and the like are used to describe various components, the positioning or order of these components are not confined by these terms. These terms are merely used to distinguish the components. Therefore, the first component to be mentioned below may be referred to as a second component in the technical concept of the present disclosure.

Like reference numerals generally denote like elements throughout the specification.

The size and thickness of each component illustrated in the drawings are illustrated for convenience of description, and the present disclosure is not limited to the relative size and thickness illustrated.

The features of the various embodiments of the present disclosure can be either partially or entirely adhered to or combined with each other, and can be assembled and operated in technically various ways, and the embodiments can be implemented independent of or in association with each other.

Hereinafter, the present disclosure will be described in detail with reference to the drawings.

Figure 2:
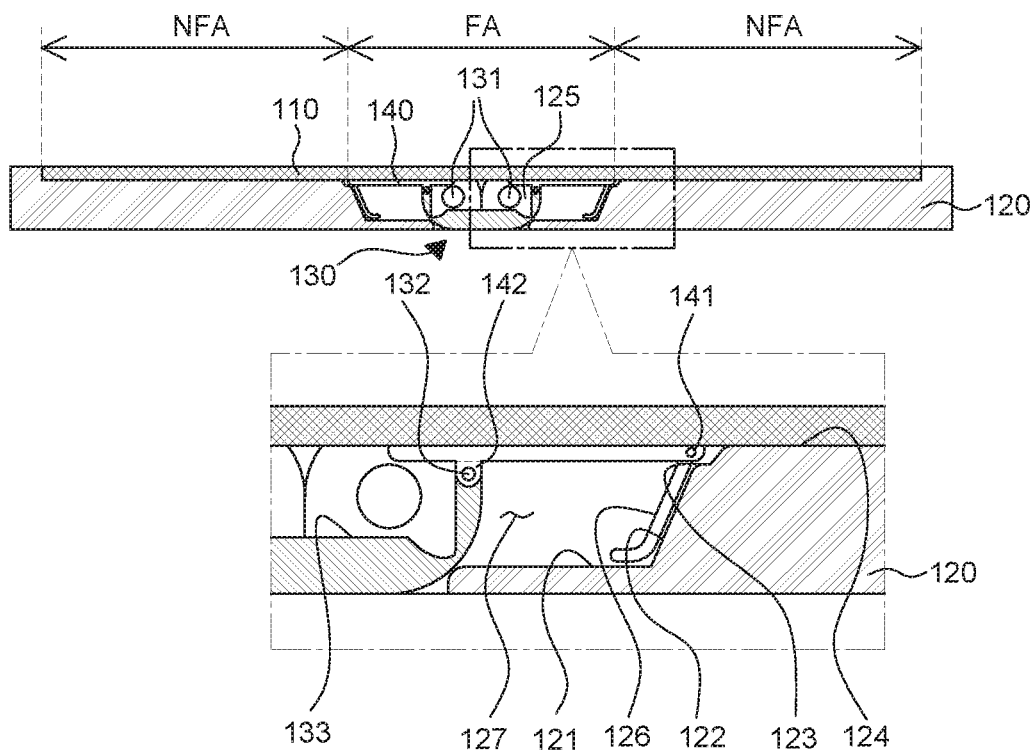
FIG. 2 is a cross-section perspective view of a foldable display device in an unfolded state according to an example embodiment of the present disclosure.

FIG. 1 is an exploded perspective view of a foldable display device according to an example embodiment of the present disclosure. FIG. 2 is a cross-section perspective view of a foldable display device in an unfolded state according to an embodiment of the present disclosure; Referring to FIGS. 1 and 2, a foldable display device 100 includes a display panel 110, a set frame (or set frames) 120, a hinge unit 130, and an adjustable support unit (or adjustable support units) 140.

The display panel 110 is a panel in which images are implemented. Display elements for implementing images, circuits, wiring lines, and components for driving the display elements may be disposed in the display panel.

The display panel 110 includes a folding area FA and non-folding areas NFA.

The folding area FA is the area where the display panel 110 is folded. When the foldable display device 100 is unfolded, the folding area is maintained to be flat, whereas when the foldable display device 100 is folded, the folding area is folded.

The non-folding areas NFA are where the display panel 110 is maintained in a flat state in both the unfolded state and the folded state of the display panel 110. The non-folding areas NFA are connected to both sides of the folding area FA to rotate inward as the folding area FA is folded. The non-folding areas NFA form one plane together with the folding area FA in the unfolded state and face each other in the folded state.

Each set frame 120 is disposed below the display panel 110 to support at least a part of the display panel 110. Specifically, each of the non-folding areas NFA of the display panel 110 is supported by an inner surface of a set frame 120.

Among the surfaces that form the inner surfaces of each set frame 120, is the a first lower surface 121, an inclined surface 122, a seating surface 123, and a second lower surface 124.

First, the second lower surface 124 is a surface that supports or otherwise accommodates the non-folding area NFA of the display panel 110. The second lower surface 124 is formed to be shallowest among the lower surfaces of the set frame 120. An adhesive material may be applied between the second lower surface 124 and the non-folding areas NFA of the display panel 110 to affix the display panel 110 to the set frame 120.

The seating surface 123 is a surface on which an end portion of an adjustable support unit 140 may be supported when in the unfolded state. The seating surface 123 is a step lower than the second lower surface 124. This step between the seating surface 123 and the second lower surface 124 restricts the end portion of an adjustable support unit 140 from sliding up to the second lower surface 124. In this instance, the step between the seating surface 123 and the second lower surface 124 may be the same as the thickness of the adjustable support units 140.

The inclined surface 122 is a surface connecting from the seating surface 123 to the first lower surface 121. The inclined surface 122 may be formed at an incline.

Among the lower surfaces of the set frame 120, the inner surface is formed to be deepest on the first lower surface 121. The first lower surface 121 is the closest to the hinge unit 130. When the foldable display device 100 is folded, the first lower surface 121 may contact the adjustable support units 140, which will be described in more detail below with reference to FIG. 4.

In the meantime, first hinge connecting units 125 are provided at both ends of one end portions of the set frame 120 and extend to the hinge unit 130. The first hinge connecting unit 125 may be connected to the hinge unit 130 through the first hinge shaft 131 and the set frame 120 may rotate about the first hinge shaft 131.

The recessed portion 127 in the set frame 120 may be described as the area in the set frame 120 bordered by the first lower surface 121, the inclined surface 122, the outer surface of the hinge unit 130, and the first hinge connecting unit 125. The recessed portion 127 may also be described as the recessed area in the inner surface of the set frame 120 adjacent to the hinge unit 130 or the as the empty space retreating from the hinge unit 130 in the inner surface of the set frame 120 that is adjacent to the hinge unit 130. When the foldable display device 100 is in an unfolded state, the adjustable support units 140 are disposed above the recessed portion 127.

A guide groove 126 is disposed to provide a guide surface on the inner surface of the set frame 120 adjacent to the the seating surface 123, the inclined surface 122, and the first lower surface 121.

In the unfolded state, the guide surface extends from towards the hinge unit 130 adjacent ends of the set frame 120 towards the first hinge connecting unit 125.

The guide surface along the guide groove 126 coincides with the rotation trajectory of the end portion of each adjustable support unit 140, such that the adjustable support units 140 will not deviate from their intended path when rotating. A protruding portion 141 of each adjustable support unit 140 is fitted to the guide groove 126. The adjustable support units 140 slide along the guide surface along the guide groove 126 when the foldable display device 100 is switched between the folded state and the unfolded state. As such, where in the unfolded state, the end portion of each adjustable support unit 140 would be positioned at the end of the guide groove 126 that is adjacent to the seating surface 123, in the folded state, the end portion of each adjustable support unit 140 would be positioned at the other end of the guide groove 126 adjacent to the first lower surface 121.

Each adjustable support unit 140 is disposed below the display panel 110 to support the display panel 110 together with the set frame 120. Specifically, the adjustable support units 140 may support the folding area FA of the display panel 110. In the unfolded state, the adjustable support unit 140 and set frames 120 form one plane. In the folded state, the adjustable support units 140 may retreat toward the inner surface of the set frame 120. That is, in the folded state, the adjustable support units 140 rotate and slide toward the lower surface of the set frame 120 to be in contact with the first lower surface 121 of the set frame 120. However, in contrast with the second lower surface 124 of the set frame 120, an adhesive material is not applied onto the adjustable support units 140 and they are not fixed to the portions of the display panel 110 they support.

Each adjustable support unit 140 includes a second hinge connecting unit 142 which extends from an arbitrary intermediate point between both end portions of the lower surface of the adjustable support unit 140 to the hinge unit 130. Each second hinge connecting unit 142 is rotatably connected to the second hinge shaft 132 of the hinge unit 130. Therefore, each adjustable support unit 140 may rotate around the second hinge shaft 132, where the rotation trajectory of both end portions of the adjustable support units 140 may be determined.

The adjustable support units 140 include protruding portions 141 disposed, in the unfolded state, at the end portion of each adjustable support unit 140 adjacent to the set frame 120. The protruding portion 141 extends towards the guide surface along the guide groove 126. This allows the protruding portion 141 to slide along the guide groove 126, when each adjustable support unit 140 rotates about the second hinge shaft 132.

The hinge unit 130 is disposed below the folding area FA of the display panel 110 and is connected to the set frames 120 and adjustable support units 140. The set frames 120 and adjustable support units 140 may rotate around the hinge unit 130. The hinge unit 130 also includes first hinge shafts 131 and second hinge shafts 132.

The first hinge shafts 131 protrude from the outer surface of both ends of the hinge unit 130 and connect to the first hinge connecting units 125 on each set frame 120. Specifically, each first hinge shaft 131 is connected to the first hinge connecting unit 125 in the set frame 120 disposed on the corresponding side of the hinge unit 130. Therefore, the foldable display device 100 according to the embodiment of the present disclosure implements a biaxial hinge structure with respect to the hinge unit 130 and set frames 120.

The second hinge shafts 132 protrude from the inner surfaces of both ends of the hinge unit 130 to each connect to a second hinge connecting unit 142 of each adjustable support unit 140. As such, each adjustable support unit 140 is connected to a hinge unit 130 by two second hinge shafts 132. For example, one of the second hinge shafts 132 may connect to the second hinge connecting unit 142 on one side of an adjustable support unit 140, while the other second hinge shaft 132 may connect to the second hinge connecting unit 142 on the other side of the adjustable support unit 140.

In the meantime, the foldable display device 100 is a display device in which display elements or circuits are formed on a flexible substrate so that even when the display device is bent, images may be displayed. Therefore, the foldable display device 100 may be switched between an unfolded state, in which the foldable display device 100 may be unfolded to be flat, and a folded state, in which the upper surfaces of the foldable display device 100 may be folded to be in contact with each other.

First, the unfolded state of the foldable display device 100 will be described in detail with reference to FIG. 2.

Referring to FIG. 2, when the foldable display device 100 is in the unfolded state, the display panel 110 is flat and the set frames 120 which support the display panel 110 are configured to form one plane.

The adjustable support units 140, together with the set frames 120, support the display panel 110 to form one plane. Further, the adjustable support units 140 are disposed to form one plane with the second lower surface 124 of the set frames 120. In this instance, the second lower surface 124 of each set frame 120 supports the non-folding areas NFA of the display panel 110 and the adjustable support units 140 support the folding area FA of the display panel 110. Therefore, the plane formed by the second lower surfaces 124 of the set frames 120, together with the adjustable support units 140, support the lower surface of the display panel 110 such that the display panel 110 may be flat.

In the unfolded state, an end portion of each adjustable support unit 140 is disposed on the seating surface 123 of the set frame 120, which allows for the adjustable support unit 140 to form a single plane with the second lower surface 124 of the set frame 120.

In the unfolded state, the adjustable support units 140 are also disposed above the recessed portion 127, and are spaced apart from the first lower surface 121.

Also, in the unfolded state, the end portions of each adjustable support unit 140 on the side of the hinge unit 130 may face each other. Further, these end portions of the adjustable support units 140 at the side of the hinge unit 130 may not overlap each other, but may be instead, spaced apart from each other. If the end portions of the adjustable support units 140 at the side of the hinge unit 130 were to overlap each other, the rotation path of the adjustable support units 140 around the second hinge shafts 132 may be interrupted. Therefore, the adjustable support units 140 may become damaged, and the display panel 110 may not be able to be supported to be flat.

The lower surface 133 of the hinge unit 130 is deeper than the second lower surface 124 of the set frame 120. In other words, the lower surface 133 of the hinge unit 130 may be lower than the second lower surface 124. In this instance, the second hinge shaft 132 of the hinge unit 130 may be disposed to be higher than the lower surface 133 of the hinge unit 130. Also, the second hinge shaft 132 may be lower than the second lower surface 124 of the set frame 120, and higher than the first lower surface 121. The second hinge shaft 132 being disposed on the level described above allows the adjustable support units 140, which are connected to the second hinge shaft 132, to form an even plane with the second lower surface 124 to support the display panel 110 to be flat.

The protruding portion 141 of the adjustable support unit 140 is disposed at one end of the guide groove 126. Specifically, as described above, the guide groove 126 is formed to coincide with the rotation trajectory of the protruding portion 141 of the adjustable support unit 140 along the guide surface. Further, one end of the guide groove 126 is formed on an even plane with the seating surface 123. Therefore, in the unfolded state, the end portion of the adjustable support units 140 will be seated on the seating surfaces 123. Also, the protruding portions 141 may be disposed at the same end of the guide groove 126.

In the unfolded state, in the foldable display device 100 according to an embodiment of the present disclosure, the set frames 120 support the non-folding areas NFA of the display panel 110 to be flat. The adjustable support units 140 may support the folding area FA of the display panel 110 to be flat. In this instance, the end portions of the adjustable support units 140 may be laid on the seating surface 123 of the set frame 120, and the adjustable support units 140 may be supported to form one plane with the second lower surfaces 124 of the set frames 120.

Hereinafter, the process of switching from the unfolded state to the folding state of the foldable display device 100 will be described in detail with reference to FIG. 3.

Figure 3:
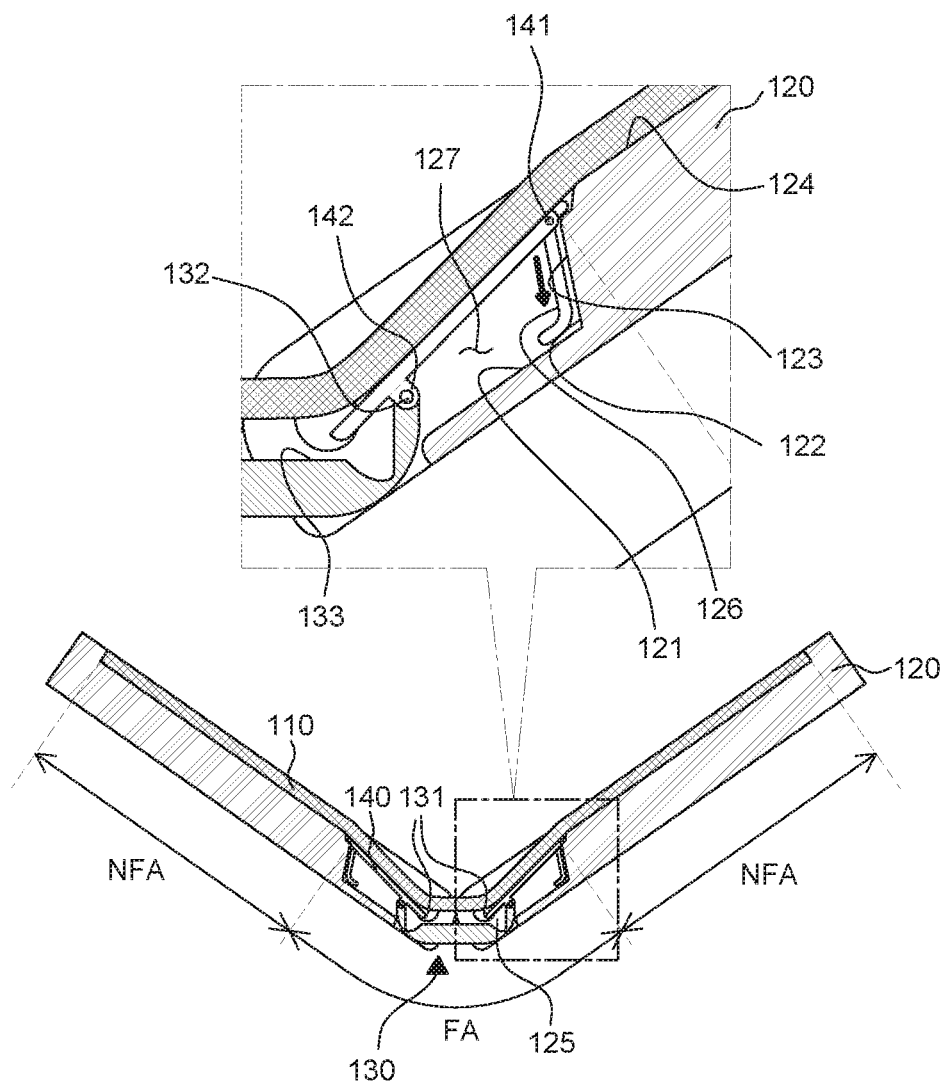
FIG. 3 is a cross-sectional view of a foldable display device according to an embodiment of the present disclosure, which is switched from an unfolded state to a folded state.

FIG. 3 is a cross-sectional view of a foldable display device 100 in the process of switching from an unfolded state to a folded state, according to an embodiment of the present disclosure.

When the foldable display device 100 is switched from an unfolded state to the folded state, the foldable display device 100 is folded such that upper surfaces of the display panel 110 in the non-folding areas NFA face each other. In this instance, the non-folding areas NFA of the display panel 110 are fixed to the second lower surface 124 of the set frame 120, to maintain the display panel 110 in a flat state. The folding area FA of the display panel 110 is not fixed to the adjustable support units 140, which support the folding area FA in the unfolded state, and may bend to accommodate any rotation in the non-folding area NFA.

The set frames 120 that support the non-folding areas NFA of the display panel 110 may rotate in a direction in which the second lower surfaces 124 come face to face with each other along the display panel 110. Specifically, the set frames 120 may rotate about the first hinge shafts 131 of the hinge unit 130, such that the second lower surfaces 124 of the set frames 120 are close to each other.

The adjustable support units 140 that support the folding area FA of the display panel 110 may rotate, from the unfolded state, towards the direction in which the upper surfaces of the display panel 110 may face each other. Further, the end portions of the adjustable support units 140 that are supported by the seating surface 123 of the set frame 120 may rotate along with the set frame 120.

When the foldable display device 100 is in an unfolded state, the end portions of the adjustable support units 140 on the side of the set frame 120 may be laid on the seating surface 123. Further, the protruding portions 141 of the end portions of the adjustable support units 140 on the side of the set frame are also disposed at one end of the guide grooves 126. When the foldable display device 100 is folded, the end portions of the adjustable support units 140 on the side of the set frame 120 may slide from the seating surface 123, down the guide surface along the inclined surface 122, towards the first lower surface 121. The end portions of the adjustable support units 140 on the side of the set frame 120, in following their respective protruding portions 141, may slide back and forth from one end of the guide groove 126 to the other end of the guide groove 126.

When the foldable display device 100 is in the unfolded state, the end portions of the adjustable support units 140 on the side of the hinge unit 130, are disposed above the lower surface 133 of the hinge unit 130. However, when the foldable display device 100 is folded, the end portions of the adjustable support units 140 on the side of the hinge unit 130 may rotate toward the inner surface of the lower surface 133 of the hinge unit 130. That is, the end portions of the adjustable support units 140 on the side of the hinge unit 130 may rotate toward the sides of the inner surface of the hinge unit 130, above the lower surface 133 of the hinge unit 130, such that they are close to the lower surface 133 of the hinge unit 130.

Hereinafter, the folded state of the foldable display device 100 will be described in detail with reference to FIG. 4.

Figure 4:
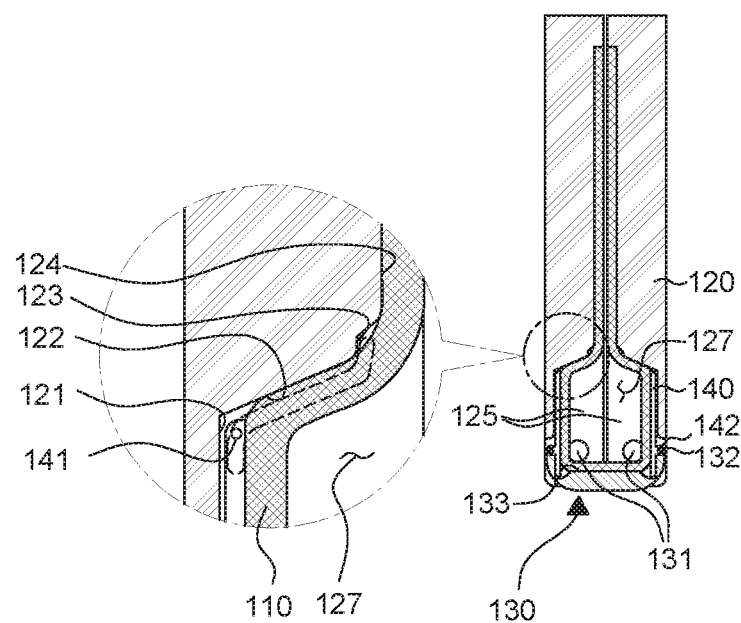
FIG. 4 is a cross-section perspective view of a foldable display device in a folded state according to an embodiment of the present disclosure.

FIG. 4 is a cross-section perspective view of a foldable display device in a folded state according to an embodiment of the present disclosure.

Referring to FIG. 4, when the foldable display device 100 is in the folded state, the upper surfaces of the display panel 110 in the non-folding areas NFA face each other. The non-folding areas NFA of the display panel 110 are affixed to the second lower surface 124 of the set frame 120, such that the display panel 110 is flat. The folding area FA of the display panel 110 may be bent to accommodate the non-folding areas NFA facing each other.

Like the non-folding areas NFA of the display panel 110, the second lower surfaces 124 of the set frames 120, which support the non-folding areas NFA of the display panel 110, similarly face each other when the foldable display device 100 is in a folded state.

As the folding area FA is bent, the adjustable support units 140 that support the folding area FA of the display panel 110 in the unfolded state cease to support the display panel 110. The adjustable support units 140 additionally move toward the first lower surface 121 of the set frames 120 so that the folding area FA of the display panel 110 may be folded. Therefore, in the folded state, the adjustable support units 140 are in contact with the first lower surface 121 of the set frames 120. Also in the folded state, the adjustable support units 140 may be perpendicular to the lower surface 133 of the hinge unit 130.

In this instance, the end portions of the adjustable support units 140 on the side away from the hinge unit 130 may be in contact with the first lower surface 121, while the protruding portions 141 on those end portions may be disposed on the end of the guide groove 126 on the first lower surface.

In the folded state, the end portions of the adjustable support units 140 on the side of the hinge unit 130 may be spaced apart from the lower surface 133 of the hinge unit 130. This is because when the adjustable support units 140 rotate, the end portions on the side of the hinge unit 130 contacting the lower surface 133 of the hinge unit 130 may restrict and limit the rotation or even lead to damage when the foldable display device 100 is folded.

In the meantime, as described with reference to FIGS. 1 and 2, each recessed portion 127 in the folded state may be defined as the space between the hinge unit 130 and the first lower surface 121 and the inclined surface 122 of each set frame 120. In the unfolded state of the foldable display device 100, the adjustable support units 140 are disposed above the recessed portion 127.

As the foldable display device 100 is switched to a folded state, the adjustable support units 140 disposed above the recessed portions 127 are in contact with the first lower surface 121 of the set frame 120, which defines the recessed portion 127. In other words, in the folded state, each adjustable support unit 140 may move onto the first lower surface 121 on the inside of the recessed portion 127.

As the foldable display device is folded in such a way that the inner surfaces of the set frames 120 face each other, the recessed portions of the set frames 120 may face each other as well. As the adjustable support units 140, formerly disposed above the recessed portions 127 move to the first lower surface 121, the recessed portions 127 may be combined. Therefore, when the foldable display device 100 is in the folded state, the folding area FA of the display panel 110 may be accommodated in the combined recessed portion 127, securing the radius of curvature for the display panel 110.

The radius of curvature is a value indicating the degree of curvature of a curved surface. The larger the radius of curvature is, the more slight the curvature is. For example, the radius of curvature of a plane is infinite, whereas the more the display panel 110 is folded, the smaller the radius of curvature becomes.

As such, the smaller the radius of curvature of a display panel 110 is capable of, the more tightly the folding area FA may be folded and the smaller the space occupied by the folded folding area FA is required to be. On the contrary, the larger the smallest radius of curvature a the display panel 110 is capable of, the more challenging it may become to completely fold the folding area FA, as the space occupied by the folding area FA may need to be increased.

In the unfolded state, the foldable display device 100, the adjustable support units 140 are disposed above the recessed portion 127 to support the folding area FA of the display panel 110. In the folded state, the adjustable support units 140 move to the inner surface of the recessed portion 127 to secure space to accommodate the folding area FA of the display panel 110. In the unfolded state, the non-folding areas NFA of the display panel 110 may be supported by the second lower surface 124 of the set frame 120 to be flat, while the folding area FA of the display panel 110 may be supported by the adjustable support unit 140 to be flat. In this instance, the end portions of the adjustable support units 140 on the side of the set frame 120 is laid on the seating surface 123 of the set frame 120 to be supported to maintain a flat state. The adjustable support units 140 cover the recessed portion 127 and forms one plane with the second lower surface 124 of the set frame 120. Therefore, in the unfolded state, even if an external force is applied to the folding area FA of the display panel 110, the display panel 110 is supported by the adjustable support units 140 disposed above the recessed portion 127, which is otherwise an empty space, and allows for the flat state of the display panel 110 to be maintained. As a result, any potential damage to the display panel 110 may be minimized.

In the folded state, the upper surfaces of the non-folding areas NFA may face each other in a flat state. Further, the second lower surfaces 124 of the set frame 120, which are fixed to the non-folding areas NFA, also face each other. The folding area FA of the display panel 110 is folded and then accommodated in the recessed portion 127 disposed in the set frames 120 and the inner surface of the hinge unit 130. When switching to an unfolded state, the adjustable support units 140 that are disposed above the recessed portion 127 in the unfolded state may rotate such that they come into contact with the first lower surface 121 in the inner surface of the recessed portion 127. In the folded state, as the set frames 120 face each other, the recessed portions 127 also face each other. Therefore, in the folded state, the folding area FA of the display panel 110 is folded to be accommodated in the recessed portion 127, including the inner surface of the hinge unit 130. In other words, in the folded state of the foldable display device 100, the adjustable support units 140 move to the first lower surface 121 of the set frame 120, and space to accommodate and secure the radius of curvature of the folding area FA of the display panel 110 is formed in the recessed portions 127 and the inner surface of the hinge unit 130.

On the end portions of each adjustable support unit 140 on the side of the set frame 120 is a protruding portion 141 that is fitted into a guide groove 126 disposed along the guide surface of the set frame 120, such that the protruding portion 141 may slide along therewith. The guide groove 126 is formed along the rotation trajectory of the rotation trajectory of the end portion of the adjustable support unit 140 on which the protruding portion 141 is disposed. Accordingly, the adjustable support units 140 may slide along the guide groove 126. Therefore, even through the repeated folding and unfolding of the foldable display device 100, the rotation trajectory continues to be guided along the guide groove 126. As the adjustable support units 140 are restricted from deviating from the rotation trajectory due to the protruding portions 141 on the guide groove 126, any potential damage to the foldable display device 100 that may otherwise occur due to a deviation from the rotation trajectory by the adjustable support units 140 may be minimized. As shown in FIG. 4, when the foldable display device 100 is in the folded state, the folding area FA may include a plurality of bends connecting to both non-folding areas NFA. The curvature of each of the plurality of bends may be different, and when the foldable display device 100 is folded, the plurality of bends may be symmetrically arranged. Further, when the foldable display device 100 is in a folded state, portions of the folding area FA of the display panel 110 may be parallel to the non-folding areas NFA, while other portion of the display panel 110 may be perpendicular to the non-folding areas NFA. The parallel portions of the folding area FA of the display panel 110 may be connected to the perpendicular portion of the folding area FA of the display panel 110. In the folded state, the distance between the opposing surfaces of the parallel portions of the folding area FA of the display panel 110 may be greater than the distance between the opposing surfaces of the non-folding areas NFA of the display panel 110. In another embodiment of the present disclosure, the outline of the folding area FA in the folded state of the foldable display device 100 may be more circular and have a more consistent curvature. In various embodiments of the present disclosure, the distance between the inner surfaces of the display panel 110 in the widest part of the folding area FA may be greater than a distance between inner surfaces of the display panel 110 in the non-folding areas NFA when the foldable display device 100 is in a folded state.

Figure 5:
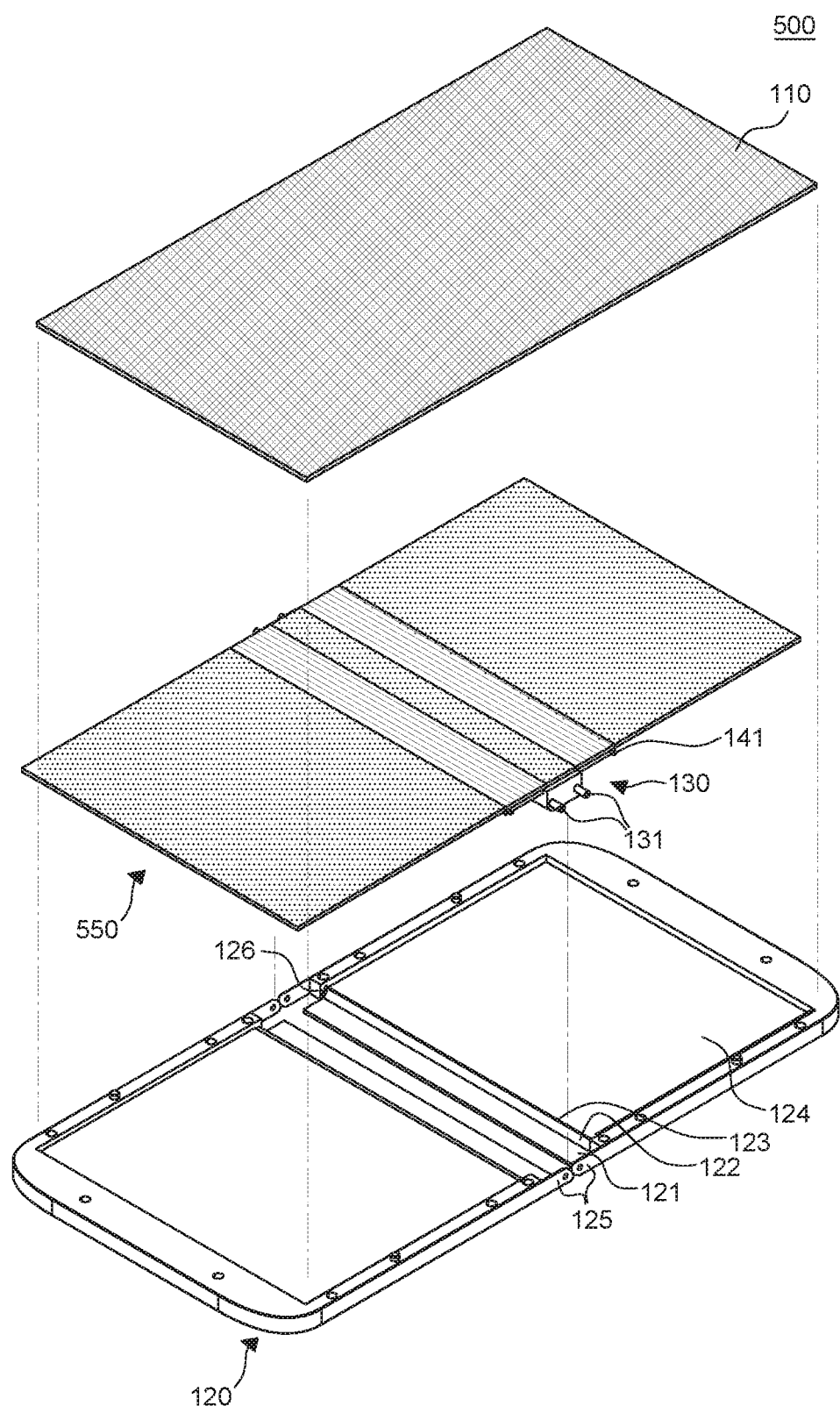
FIG. 5 is an exploded perspective view of a foldable display device according to another embodiment of the present disclosure.
Figure 6:
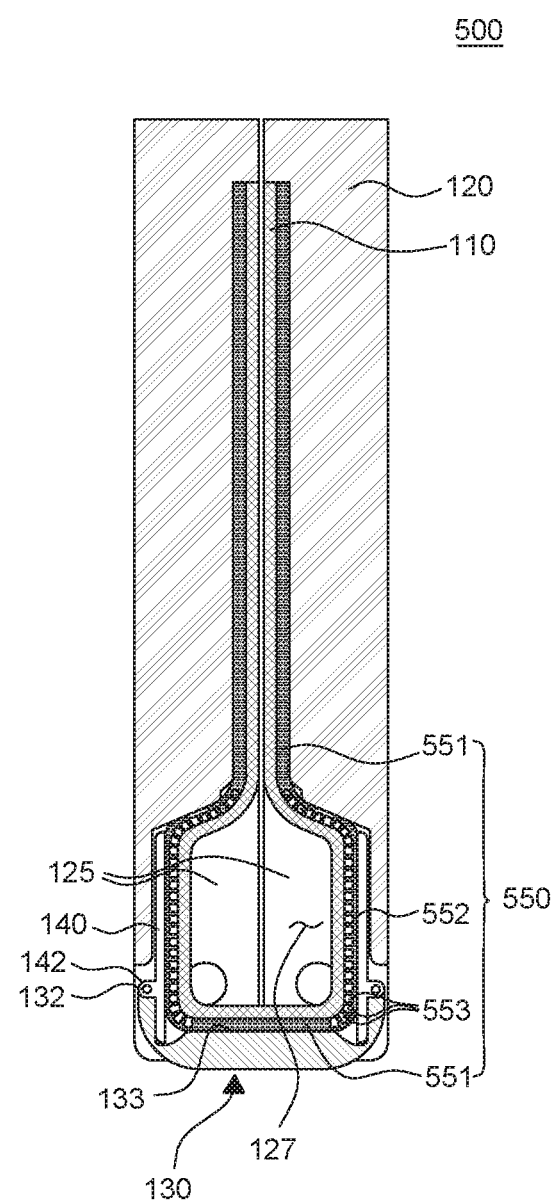
FIG. 6 is a cross-section perspective view of a foldable display device in a folded state according to another embodiment of the present disclosure.

FIG. 5 is an exploded perspective view of a foldable display device according to another embodiment of the present disclosure. FIG. 6 is a cross-section perspective view of the same foldable display device in a folded state according to another embodiment of the present disclosure. The foldable display device 500 of FIGS. 5 and 6 may largely be distinguished from the foldable display device 100 of FIGS. 1 to 4 by the inclusion of a mid-frame 550, while many of the other components are substantially the same. Therefore, redundant descriptions shall be omitted herein.

Referring to FIGS. 5 and 6, the foldable display device 500 further includes a mid-frame 550.

The mid-frame 550 is attached to the lower surface of the display panel 110 and disposed on the set frames 120 and the adjustable support units 140. The mid-frame 550 is a plate-type frame that protects and supports the display panel 110 and may be affixed to the display panel 110 by an adhesive material.

The mid-frame 550 may include deformable portions 552 and flat portions 551.

The flat portions 551 are the area of the mid-frame 550 that overlap the non-folding area NFA of the display panel 110, where a flat state is maintained. When the foldable display device 500 is in the unfolded state, the end portions of the adjustable support units 140 on the sides of the hinge unit 130 are spaced apart from each other. The flat portions 551 also include this area between the end portions of the adjustable support units 140 on the sides of the hinge unit 130. That is, the flat portions 551 are made up of the entire mid-frame 550, excluding the areas overlapping the adjustable support units 140. The lower surface of the flat portions 551 corresponding to the non-folding areas NFA may be affixed to the second lower surface 124 by an adhesive material. The flat portions 551 disposed in the folding area FA may support the portion of the folding area FA which is not supported by the adjustable support units 140 due to the end portions of the adjustable support units 140 on the side of the hinge unit 130 being separated.

The deformable portions 552 are the flexible areas of the mid-frame 550 that overlap the adjustable support units 140. In the unfolded state, the deformable portions 552 are disposed to be in contact with the adjustable support units 140 and the lower surface of the deformable portions 552 may be supported by the adjustable support unit 140. However, the deformable portions 552 may not be affixed to the adjustable support units 140 by any adhesive materials. In the folded state, the deformable portions 552 have the flexibility to be folded together with the folding area FA of the display panel 110.

Referring to FIG. 6, a plurality of patterns 553 may be disposed on the deformable portions 552 of the mid-frame 550. The plurality of patterns 553 affords the deformable portions 552 of the mid-frame 550 more flexibility. The deformable portions 552 of the mid-frame 550 may be more easily folded where the plurality of patterns 553 is disposed.

Accordingly, as the folding area FA of the display panel 110 is folded, the deformable portions 552 of the mid-frame 550 may also be folded In FIGS. 5 and 6, it is illustrated that the plurality of patterns 553 has a slit pattern, but as long as the plurality of patterns 553 would allow the deformable portion 552 of the mid-frame 550 to have flexibility, the pattern is not limited thereto.

The foldable display device 500 according to another embodiment of the present disclosure disposes the mid-frame 550 between the display panel 110 and the adjustable support unit 140. The mid-frame 550 includes flat portions 551 and deformable portions 552. In the unfolded state, the flat portions 551 of the mid-frame 550 may support the area of the folding area FA of the display panel 110 that is not supported by the adjustable support unit 140. In the folded state, the deformable portions 552 of the mid-frame 550, which overlaps the adjustable support unit 140, has the flexibility to be folded along with the folding area FA of the display panel 110. Specifically, in the unfolded state, the flat portions 551 of the mid-frame 550 overlap the entire non-folding area NFA of the display panel 110 and the portion of the folding area FA of the display panel 110 that does not overlap the adjustable support unit 140. The end portions of the adjustable support units 140 on the side of the hinge unit 130 may be spaced apart from each other to allow space for the adjustable support units 140 to rotate. One of the flat portions 551 is disposed over the area between these separated end portions of the adjustable support units 140. This flat portion 551 may support the region of the folding area FA of the display panel 110 that is not supported by the adjustable support unit 140. Therefore, in the unfolded state, the entire folding area FA is supported by this flat portion 551 of the mid-frame 550, together with the adjustable support units 140, and the display panel 110 is maintained in a flat state.

In the unfolded state, the deformable portions 552 of the mid-frame 550 overlap the adjustable support units 140. A plurality of patterns 553 is disposed on each deformable portion 552 so that the deformable portions 552 have flexibility. In the folded state, the adjustable support units 140 do not support the folding area FA, but move to the first lower surface 121 of the set frame 120 such that the folding area FA of the display panel 110 will not be maintained to be flat, but folded. In this instance, the deformable portions 552 of the mid-frame 550 overlapping the adjustable support units 140 may be folded together with the folding area FA of the display panel 110. Therefore, the display device according to an embodiment of the present disclosure disposes the mid-frame 550 below the display panel 110, such that in the unfolded state, the area in the folding area FA of the display panel 110 that is not supported by either of the adjustable support units 140 may be supported nonetheless by the flat portion 551 of the mid-frame 550, and in the folded state, the deformable portions 552 of the mid-frame 550 may be folded together with the folding area FA of the display panel 110.

The embodiments of the present disclosure can also be described as follows:

According to an aspect of the present disclosure, a foldable display device that includes: a hinge unit; set frames hinged to the hinge unit; a display panel that is at least partially supported by an inner surface of the set frames and configured to be switched between a folded state, in which the set frames are folded, and an unfolded state, in which the set frames are unfolded; adjustable support units that are connected to the hinge unit, configured to support the display panel together with the inner surface of the set frames in the unfolded state and retreat into the inner surface of the set frame in the folded state.

The recessed portion of the inner surface of the set frame may be formed adjacent to the hinge unit, and the adjustable support units may be configured to be disposed above the recessed portion in the unfolded state and disposed in the recessed portion in the folded state.

In the unfolded state, the adjustable support units may be supported by the set frames.

In the folded state, the adjustable support units may be in contact with the lower surfaces of the set frame that define the recessed portions.

The inner surface of the hinge unit may be deeper than the inner surface of the set frame, the connecting units of the adjustable support units and the hinge unit may be disposed to be higher than the inner surface of the hinge unit, and the end portions of the adjustable support units on the side of the hinge unit may be formed such that they do not touch the inner surface of the hinge unit in the folded state.

In the unfolded state, the adjustable support units, together with the set frames may form one plane.

To aid in the switching or transitioning between the unfolded state and the folded state, a part of each adjustable support unit may be fitted to the set frame to be slidably guided along the rotation trajectory of each adjustable support unit.

Each adjustable support unit may include a protruding portion configured to slidably move along the guide surface of the set frame and, in the unfolded state, be laid on the set frame so as not to allow the adjustable support unit to retreat into the recessed portion.

The foldable display device may further include a plate-type mid-frame disposed between the set frames and the display panel, with such mid-frame including flexible deformable portions having a plurality of patterns to allow flexibility in the flexible deformable portions, in the areas of the mid-frame overlapping the adjustable support units.

The plurality of patterns may have a slit pattern.

According to an another aspect of the present disclosure, a foldable display device may include a hinge unit, set frames hinged to the hinge unit on both sides of the hinge unit, a display panel that is at least partially supported by the inner surface of the set frame, and adjustable support units that are connected to the hinge unit on both sides of the hinge unit and support the display panel, together with the inner surfaces of the set frames, in the unfolded state. When the display panel is in a folded state, the adjustable support units are accommodated in the inner surfaces of the set frames.

The inner surfaces of each set frame may include a second lower surface and a first lower surface between the second lower surface and the hinge unit. The the second lower surface may be shallower than the first lower surface.

The display panel may be supported by the second lower surfaces of the set frames, and in the unfolded state, the adjustable support units may be spaced apart from the first lower surfaces to form one plane with the second lower surface. In the folded state, the adjustable support units may be in contact each of the first lower surfaces.

The lower surface of the hinge unit may be disposed to be lower than the second lower surface of the set frame, and the adjustable support units may be rotatably connected to the hinge unit at an arbitrary intermediate point between both end portions of each adjustable support unit, where an end portion of the adjustable support unit, on the side of the hinge unit, may be spaced apart from the lower surface of the hinge unit in the folded state.

Although the embodiments of the present disclosure have been described in detail with reference to the accompanying drawings, the embodiments of the invention are not limited thereto and may be embodied in many different forms without departing from the technical concept of the present disclosure. Therefore, the embodiments of the present disclosure are provided for illustrative purposes only, and not intended to limit the technical concept of the present disclosure. The scope of the technical concept of the present disclosure is not limited thereto. It should be understood that the above-described embodiments are illustrative, and should not limit the present disclosure. The protective scope of the present disclosure should, instead, be construed based on the following claims, and all the technical concepts in the scope thereof, should be construed as falling within the scope of the present disclosure.

What is claimed is:

1. A foldable display device configured to be switched between
    a folded state and an unfolded state, the foldable display device comprising:
    a display panel including a folding area and non-folding areas;
    set frames supporting the non-folding areas, and including recessed portions corresponding to the folding area; and
    adjustable support units configured to support the display panel of the foldable display device together with an inner surface of the set frames in the unfolded state and including a second hinge connecting unit which extends from an intermediate point between both end portions of a lower surface of each adjustable support unit to a hinge unit, the second hinge connecting unit of each adjustable support unit rotates about a second hinge shaft of the hinge unit,
    wherein the recessed portions of the set frames are empty spaces formed across a majority of a width direction of the set frames,
    wherein the inner surface of each set frame includes a first lower surface contacting the adjustable support unit in the folded state, a seating surface on which an end portion of the adjustable support unit is supported in the unfolded state, an inclined surface connecting from the seating surface to the first lower surface to have a slope with the first lower surface and the seating surface, and a second lower surface that supports one non-folding area of the display panel, and
    wherein, in the folded state, portions of the display panel corresponding to the adjustable support units in the folding area are parallel to the non-folding areas, and another portion of the display panel corresponding to the hinge unit in the folding area is perpendicular to the non-folding areas.

2. The foldable display device according to claim 1, wherein the recessed portions in the inner surface of the set frames are adjacent to the hinge unit, and
    wherein the adjustable support units are above the recessed portions in the unfolded state and in the recessed portions in the folded state.

3. The foldable display device according to claim 2, wherein the set frames accommodate the adjustable support units in the unfolded state.

4. The foldable display device according to claim 3, wherein in the folded state, each adjustable support unit is configured to be in contact with a recessed portion of the recessed portions.

5. The foldable display device according to claim 3, wherein a bottom surface of the hinge unit is detached from the set frames,
- wherein each adjustable support unit and a connecting portion of the hinge unit is above the bottom surface of the hinge unit, and
- wherein an edge of each adjustable support unit is configured to extend so as not to touch the bottom surface of the hinge unit in the folded state.

6. The foldable display device according to claim 1, wherein in the unfolded state, the adjustable support units and the set frames form one plane.

7. The foldable display device according to claim 1, wherein when shifting from the unfolded state and to folded state, a part of the adjustable support unit at a side of the set frames guides a rotation trajectory of the end portion of the adjustable support unit in a sliding manner.

8. The foldable display device according to claim 7, wherein each adjustable support unit includes a protruding portion configured to slide along a guide surface of the set frames, and
- wherein, in the unfolded state, the protruding portion is configured to be laid on the set frames so as not to retreat into the recessed portions.

9. The foldable display device according to claim 1, further comprising:
- a plate-type mid-frame between the set frames and the display panel, and between the adjustable support unit and the display panel,
- wherein the plate-type mid-frame includes a flexible deformable portion in an area overlapping the adjustable support units, and
- wherein a plurality of patterns are on the plate-type mid-frame to allow the flexible deformable portion to have flexibility.

10. The foldable display device according to claim 9, wherein the plurality of patterns have a slit pattern.

11. The foldable display device according to claim 1, wherein the adjustable support units are interposed between the set frames in the unfolded state over the entire width of the display panel.

12. The foldable display device according to claim 1, wherein, when in the folded state, a portion of the display panel in the folding area and a portion of the display panel in the non-folding areas are parallel when viewed in a cross section of the foldable display device.

13. The foldable display device according to claim 1, wherein the seating surface is a step lower than the second lower surface, and the step between the seating surface and the second lower surface restricts the end portion of the adjustable support unit from sliding up to the second lower surface.

14. The foldable display device according to claim 1, further comprising:
- first hinge connecting units provided at both ends of one end portions of the set frame and extend to the hinge unit,
- wherein each first hinge connecting unit is connected to the hinge unit through a first hinge shaft and the set frame rotates about the first hinge shaft.

* * * * *